United States Patent
Lofthouse et al.

(10) Patent No.: US 10,581,241 B2
(45) Date of Patent: Mar. 3, 2020

(54) CLAMPING INDUCTIVE FLYBACK VOLTAGE TO REDUCE POWER DISSIPATION

(71) Applicant: Silicon Laboratories Inc., Austin, TX (US)

(72) Inventors: Sean A. Lofthouse, Pflugerville, TX (US); Alan L. Westwick, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/629,949

(22) Filed: Jun. 22, 2017

(65) Prior Publication Data

US 2018/0375325 A1 Dec. 27, 2018

(51) Int. Cl.
| | | |
|---|---|---|
| H02M 1/32 | (2007.01) | |
| H02M 1/34 | (2007.01) | |
| H03K 17/08 | (2006.01) | |
| H03K 17/16 | (2006.01) | |
| H03K 17/30 | (2006.01) | |

(Continued)

(52) U.S. Cl.
CPC ............ *H02H 9/047* (2013.01); *H03K 17/08* (2013.01); *H02M 1/32* (2013.01); *H02M 1/34* (2013.01); *H02M 2001/342* (2013.01); *H03K 17/082* (2013.01); *H03K 17/165* (2013.01); *H03K 17/30* (2013.01); *H03K 17/601* (2013.01); *H03K 17/64* (2013.01); *H03K 2217/0036* (2013.01)

(58) Field of Classification Search
CPC ............... H02H 9/047; H03K 17/08; H03K 2217/0036; H03K 17/10; H03K 17/102; H03K 17/12; H03K 17/122; H03K 17/16; H03K 17/161; H03K 17/30; H03K 17/302; H03K 17/601; H03K 17/64; H03K 17/691; H03K 17/731; H03K 19/003; H03K 19/00315; H03K 19/00346; H03K 19/00361; H02M 1/32; H02M 1/34; H02M 2001/342; H02M 2001/344

USPC ............... 363/18–21.04, 21.12–21.18; 327/108–112, 309–332

See application file for complete search history.

(56) References Cited

U.S. PATENT DOCUMENTS 4,553,082 A * 11/1985 Nesler ............... H02M 3/155
                                                   323/282
5,091,817 A *  2/1992 Alley ................ H02H 9/047
                                                   361/111

(Continued)

OTHER PUBLICATIONS

Potter & Brumfield, TE Relay Products, "The application of relay coil suppression with DC relays", pp. 1-2, Nov. 1998.

*Primary Examiner* — Nguyen Tran
*Assistant Examiner* — David A. Singh
(74) *Attorney, Agent, or Firm* — Zagorin Cave LLP

(57) ABSTRACT

A switch controls current to be supplied to an inductive load when turned on. A clamp circuit clamps a flyback voltage resulting from turning off the switch. The clamp circuit has a first clamping voltage responsive to the switch being turned off, and has a second clamping voltage, higher than the first clamping voltage, responsive to a current level through the inductive load being lower than a predetermined current level. That ensures that as the current comes down to levels required to break contact, the clamp voltage is increased to speed the collapse of the magnetic field when needed to minimize contact wear by maintaining armature momentum.

21 Claims, 9 Drawing Sheets

(51) Int. Cl.
  *H03K 17/64* (2006.01)
  *H02H 9/04* (2006.01)
  *H03K 17/082* (2006.01)
  *H03K 17/60* (2006.01)

(56) References Cited

U.S. PATENT DOCUMENTS

| | | | | |
|---|---|---|---|---|
| 5,444,594 A * | 8/1995 | Tanaka | | H02M 3/135 |
| | | | | 361/58 |
| 5,561,391 A * | 10/1996 | Wellnitz | | H03K 17/0822 |
| | | | | 327/309 |
| 5,646,832 A * | 7/1997 | Pulhamus, Jr. | | H02M 1/4208 |
| | | | | 363/133 |
| 5,856,904 A * | 1/1999 | Pelly | | H02H 3/50 |
| | | | | 361/111 |
| 6,088,247 A * | 7/2000 | Cheng | | H02M 3/33569 |
| | | | | 363/16 |
| 6,700,428 B2 * | 3/2004 | Sander | | H03K 17/0822 |
| | | | | 327/312 |
| 8,243,405 B2 * | 8/2012 | Hemon | | B60T 8/1755 |
| | | | | 361/111 |
| 9,787,179 B1 * | 10/2017 | Clarkin | | H02M 3/156 |
| 9,991,803 B1 * | 6/2018 | Wang | | H02M 3/33507 |
| 2003/0039128 A1 * | 2/2003 | Cohen | | H02M 3/158 |
| | | | | 363/20 |
| 2004/0264215 A1 * | 12/2004 | Ambo | | H02M 1/36 |
| | | | | 363/17 |
| 2008/0013346 A1 * | 1/2008 | Westmoreland | | H02M 1/34 |
| | | | | 363/37 |
| 2008/0247105 A1 * | 10/2008 | Divan | | H02H 3/207 |
| | | | | 361/56 |
| 2009/0010035 A1 * | 1/2009 | Williams | | H02M 3/158 |
| | | | | 363/131 |
| 2009/0102541 A1 * | 4/2009 | Lopez | | H02M 1/08 |
| | | | | 327/434 |
| 2009/0268489 A1 * | 10/2009 | Lin | | H02M 1/34 |
| | | | | 363/50 |
| 2010/0019748 A1 * | 1/2010 | Kleine | | H02M 3/158 |
| | | | | 323/282 |
| 2010/0067259 A1 * | 3/2010 | Liu | | H02M 3/33569 |
| | | | | 363/21.01 |
| 2010/0134941 A1 * | 6/2010 | Nakahara | | H03K 17/0822 |
| | | | | 361/91.1 |
| 2010/0232081 A1 * | 9/2010 | Disney | | H01L 27/0266 |
| | | | | 361/91.5 |
| 2010/0296210 A1 * | 11/2010 | Ball | | H01L 27/0285 |
| | | | | 361/56 |
| 2011/0062932 A1 * | 3/2011 | Hawkes | | H02M 3/156 |
| | | | | 323/288 |
| 2011/0205674 A1 * | 8/2011 | Divan | | H02H 3/207 |
| | | | | 361/56 |
| 2012/0212981 A1 * | 8/2012 | Lin | | H02M 3/33507 |
| | | | | 363/21.15 |
| 2013/0300390 A1 * | 11/2013 | Lee | | H02M 3/1563 |
| | | | | 323/282 |
| 2014/0085760 A1 * | 3/2014 | Lui | | H01L 27/0255 |
| | | | | 361/91.5 |
| 2014/0104887 A1 * | 4/2014 | Mayell | | H02M 3/28 |
| | | | | 363/15 |
| 2014/0185333 A1 * | 7/2014 | Yang | | H02M 3/33569 |
| | | | | 363/21.12 |
| 2014/0307484 A1 * | 10/2014 | Yang | | H02M 3/33569 |
| | | | | 363/21.12 |
| 2015/0085418 A1 * | 3/2015 | Buzzetti | | H01H 47/22 |
| | | | | 361/149 |
| 2015/0097613 A1 * | 4/2015 | Roewe | | H03K 17/0822 |
| | | | | 327/382 |
| 2015/0263639 A1 * | 9/2015 | Russell | | H02M 7/06 |
| | | | | 363/126 |
| 2016/0301310 A1 * | 10/2016 | Mednik | | H02M 3/158 |
| 2016/0352318 A1 * | 12/2016 | Amit | | H03K 17/0814 |
| 2016/0365801 A1 * | 12/2016 | Phadke | | H02M 3/33546 |
| 2017/0256938 A1 * | 9/2017 | Fukuhara | | H01L 27/0285 |
| 2017/0373679 A1 * | 12/2017 | Yerger | | H03K 17/0828 |
| 2018/0097447 A1 * | 4/2018 | Iorio | | H02M 3/33523 |
| 2018/0205311 A1 * | 7/2018 | Davila | | H02M 3/33569 |
| 2019/0036459 A1 * | 1/2019 | Ding | | H02M 3/33569 |

* cited by examiner

CLAMPING INDUCTIVE FLYBACK VOLTAGE TO REDUCE POWER DISSIPATION

BACKGROUND

Field of the Invention

This invention relates to voltage clamps for inductive loads.

Description of the Related Art

Turning off an inductive load using a switch can result in significant flyback voltage. Clamp circuits are used to protect the switch by clamping the voltage at a level that will keep the switch from being damaged. The clamp circuit can be implemented as a simple diode. However, when the inductive load is a relay, the low clamp voltage provided by a diode clamp provides slow demagnetization of the relay coil that can result in relay contact arcing and premature wear of the relay contacts.

Accordingly, inductive loads that are relay circuits utilize high voltage clamps to provide faster demagnetization of the relay coil. FIGS. 1 and 2 illustrate alternative high voltage clamp configurations. FIG. 1 shows a clamp circuit in series with the inductive load. The energizing current path 101 includes the inductive load 103 and the switch 105. When the switch 105 opens, significant positive flyback voltage occurs as the inductor tries to maintain the current through the inductor. With the clamp energized, the demagnetization current 107 flows through the clamp 109 and returns to the 24 V power supply 115.

FIG. 2 shows the energizing current path 201 through the inductive load 203 and the switch 205. The clamp 209 is in parallel with the load 203. When the switch 205 opens, significant positive flyback voltage occurs as the inductor tries to maintain the current through the inductor. With the clamp on, the demagnetization current 207 flows through the clamp 209 and is returned to the inductor 203 rather than the power supply 215. Both clamp configurations shown in FIGS. 1 and 2 provide effective reverse EMF to increase the speed of demagnetization of the inductor.

SUMMARY OF EMBODIMENTS OF THE INVENTION

In order to provide lower power consumption than traditional high voltage clamp configurations, embodiments described herein utilize a dynamic clamp that initially provides a low voltage clamp to reduce power consumption but then switches to a high voltage clamp to provide sufficient reverse EMF to increase the speed of demagnetization and avoid damage to the switch or relay contacts.

Accordingly, an embodiment provides a method that includes setting a clamp circuit to a first clamp voltage to clamp a flyback voltage of an inductive load. The method senses a current through a loop that includes the inductor and the clamp circuit and provides a sensed current indication. The clamp circuit is set to a second clamp voltage responsive to the sensed current indication being at a first current value, where the second clamp voltage is greater in magnitude than the first clamp voltage.

In another embodiment, an apparatus includes a clamp circuit for clamping a flyback voltage associated with an inductor. The clamp circuit is configured to have a first clamp voltage responsive to a switch controlling current flowing in the inductor being turned off. A current sense circuit provides an indication of current flowing through a first loop formed by the inductor and the clamp circuit. The clamp circuit is configured to have a second clamp voltage, higher in magnitude than the first clamp voltage, responsive to the indication that current flowing through the inductor is at a first current value.

In another embodiment, an apparatus includes a first switch configured to cause current to be supplied to an inductive load when turned on. A clamp circuit clamps a flyback voltage resulting from turning off the first switch. The clamp circuit is configured to have a first clamping voltage responsive to the switch being turned off, and to have one or more additional clamping voltages, higher than magnitude than the first clamping voltage, responsive to a current level through a loop including the clamp circuit and the inductive load being lower than a predetermined current level.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
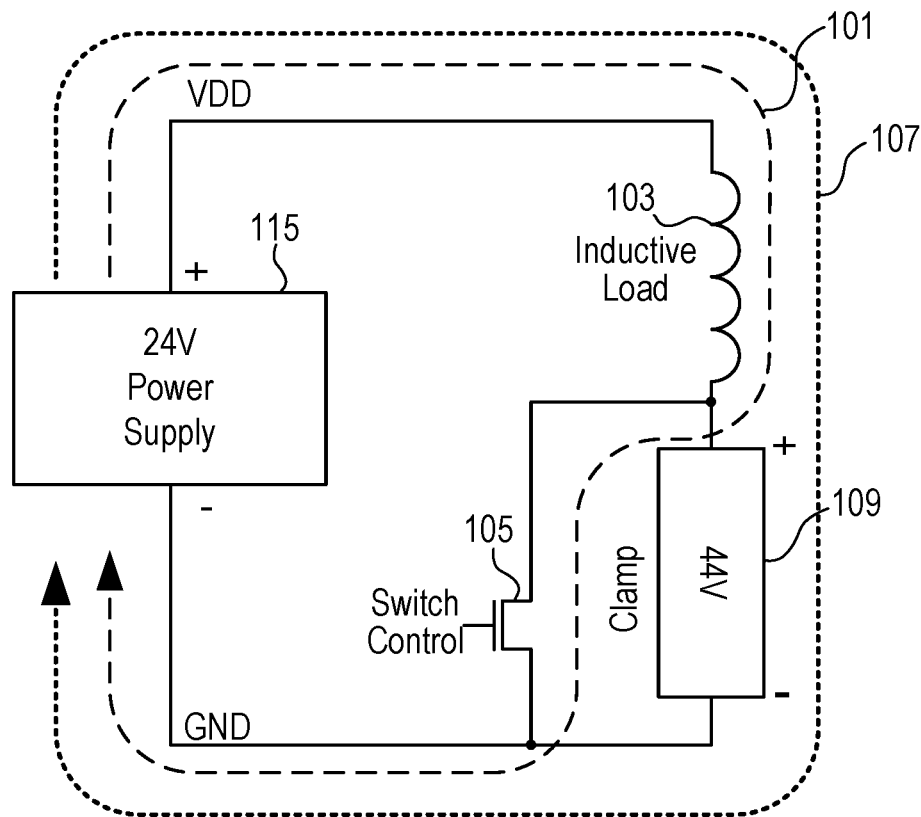
FIG. 1 shows a high voltage clamp configuration where current returns to the power supply.
Figure 2:
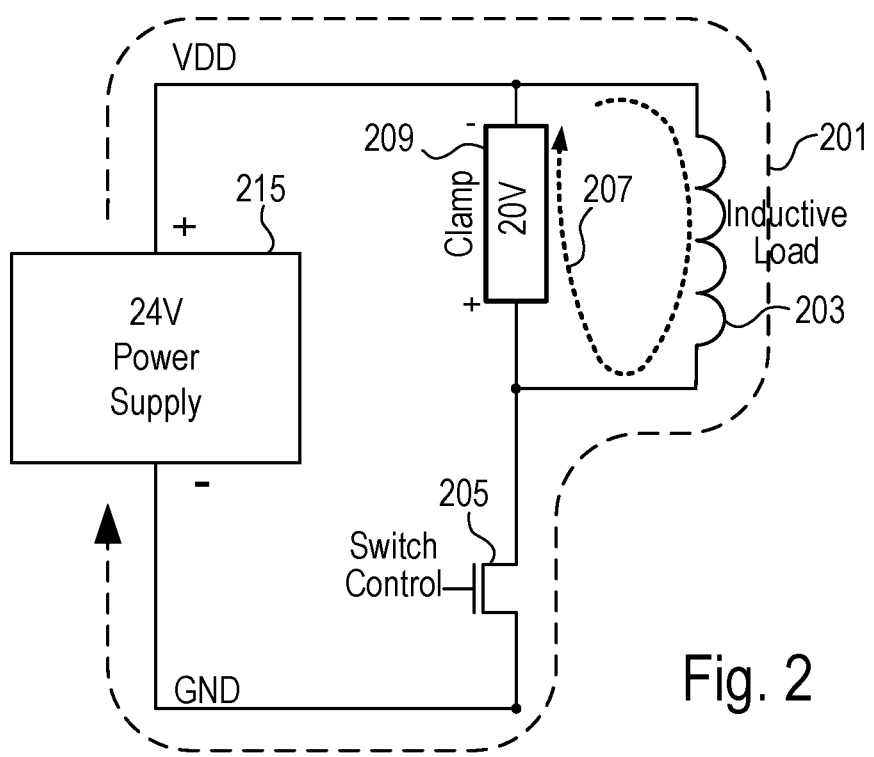
FIG. 2 shows a high voltage clamp configuration where the current returns to the inductor.

Both approaches shown in FIGS. 1 and 2 increase the speed of demagnetization with fixed clamps. The configuration of FIG. 1 is area efficient because the switch 105 can also be used as the clamp circuit, but the on-chip power dissipation is higher than the configuration of FIG. 2 since the demagnetization current flows through the power supply and 44V clamp instead of the 20V clamp of FIG. 2. However, the power consumption of the clamps of both configurations can be significant when clamping the flyback voltage resulting from switching off current to an inductive load.

Figure 3:
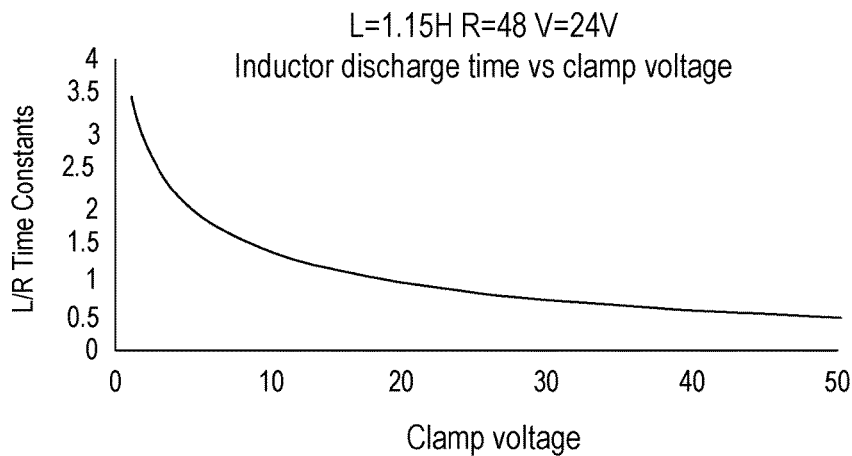
FIG. 3 illustrates an example of the relationship between clamp voltage and inductor discharge time.

The system can clamp the voltage at a low voltage level to lower power dissipation, but that results in slow discharge. For example, a diode can be used as a low voltage clamp. However, in the case of relay loads, the slow collapse of the magnetic field causes the relay contacts to separate slowly, resulting in increased arcing between the contacts and premature wear. The challenge is to keep the power dissipation low, without sacrificing the speed of collapsing the magnetic field to protect premature wear of the relay contacts by ensuring the clamp voltage is sufficiently high when needed. FIG. 3 illustrates an example of the relationship between clamp voltage and inductor discharge time. As can be seen, the higher the clamp voltage, the lower the time constants and thus faster inductor discharge.

Figure 4:
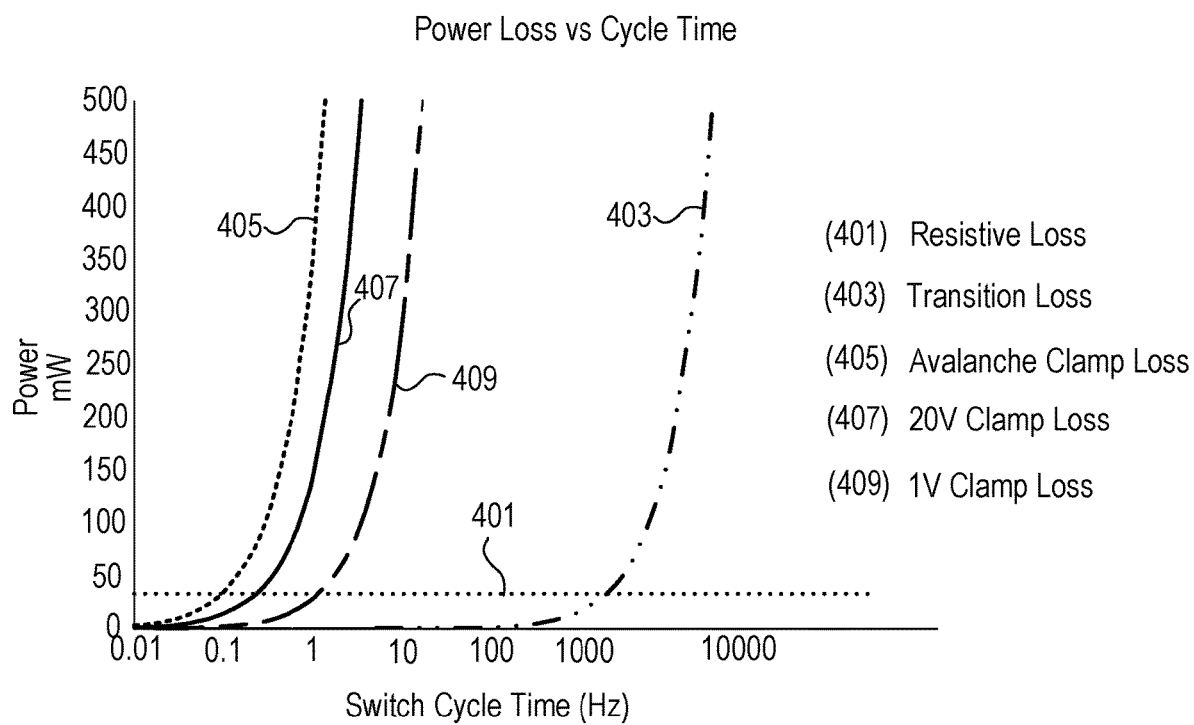
FIG. 4 shows various types of power losses associated with a system having an inductive load and a clamp circuit.

FIG. 4 shows various types of power losses associated with a system having an inductive load and a clamp circuit. The resistive loss 401 is power loss caused by current through the main switch (see, e.g., 105 in FIG. 1). Transition loss 403 is the power loss from turning the main switch on and off. When switching off the main switch, the high voltage causes the switch to avalanche resulting in avalanche power loss 405. Curve 407 represents power loss in a 20V inductor returned clamp, where the current is returned to the inductor. Curve 409 represents power loss in a 1V inductor returned clamp. The switch cycle time is shown on the x axis. As can be seen, clamping loss (avalanche, 20V, 1V) dominates over resistive loss and transition loss. As can also be seen in FIG. 4, the 20V clamp loss is significantly higher than the 1V clamp loss. For example, at a switch cycle time of 1 Hz, 20V clamp loss is approximately 140 mW and 1V clamp loss is approximately 28 mW.

The relay contact make and break cycles have hysteresis. The current required to make contact is much higher than the current required to release the contacts. It is important to have a high voltage around the time the contacts are separating. Thus, embodiments described herein dynamically change the clamping voltage to reduce the power dissipation in the clamp without sacrificing the rate that the magnetic field collapses when the relay contacts are separating by ensuring a high clamp voltage is present to quickly discharge the inductor. Embodiments of the invention monitor the current flowing through the inductive load after the switch supplying current to the inductor is opened resulting in flyback voltage. When the current through the inductive load is higher than the release current for the contacts, the clamp voltage is kept low to minimize power consumption. As the current comes down to levels required to break contact, the clamp voltage is increased to speed the collapse of the magnetic field when needed to minimize contact wear by maintaining armature momentum.

Figure 5A:
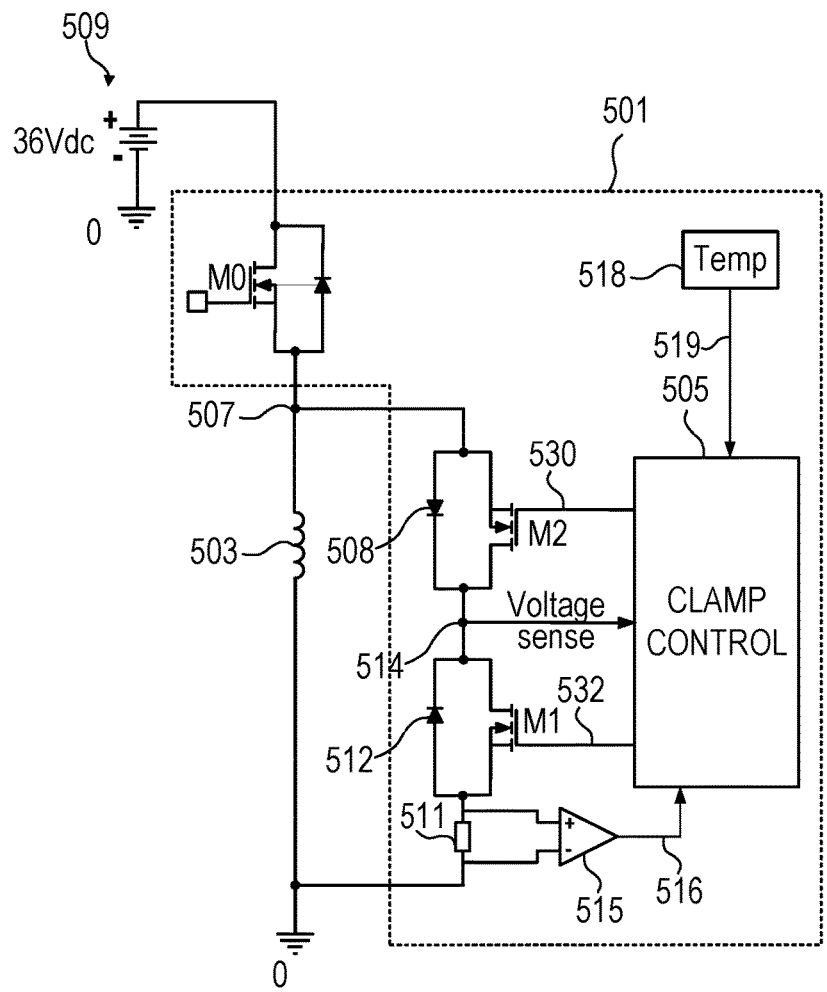
FIG. 5A illustrates a high level diagram of a clamp circuit according to an embodiment.
Figure 5B:
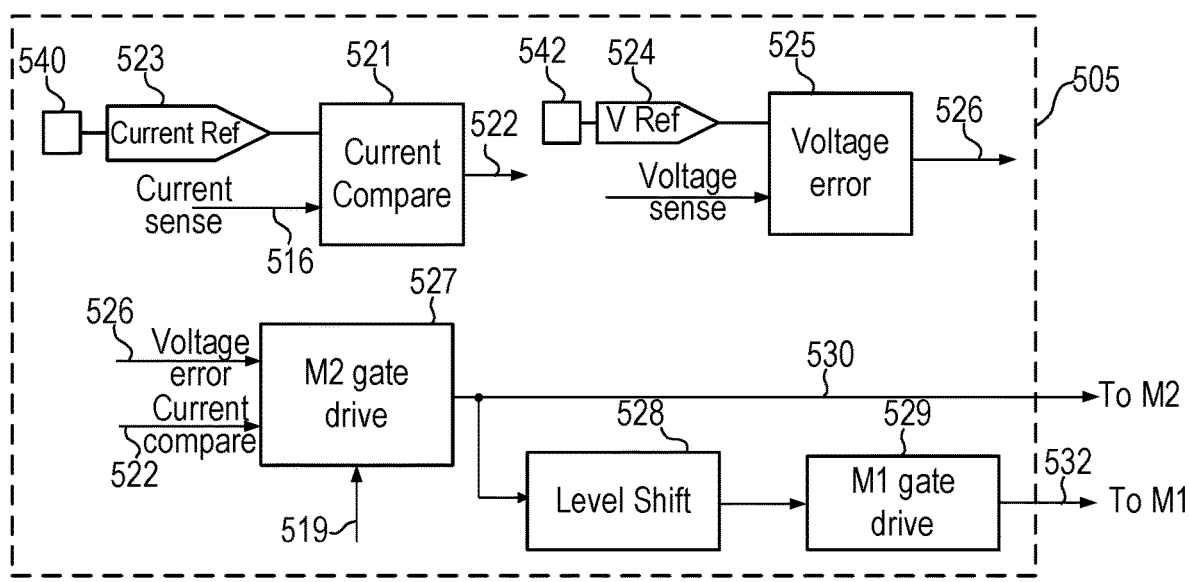
FIG. 5B illustrates a high level block diagram of an embodiment of a control circuit for the clamp circuit of FIG. 5A.
Figure 6:
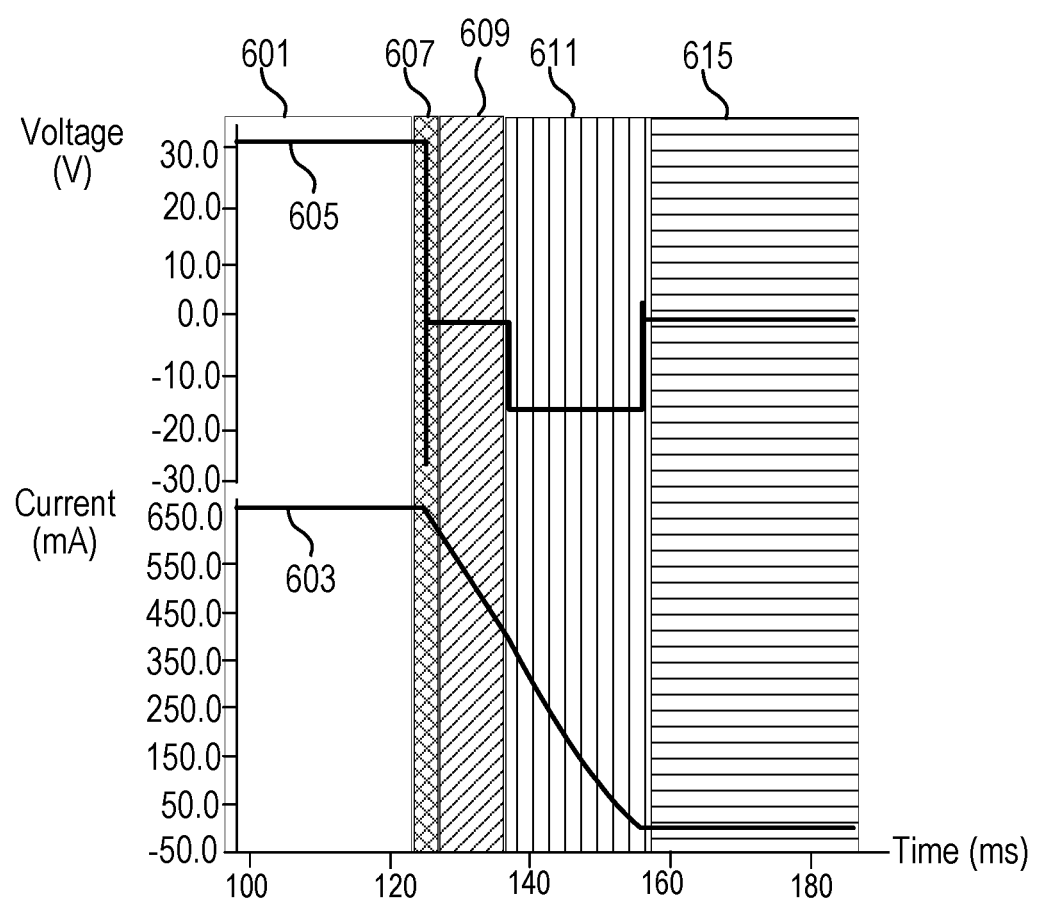
FIG. 6 illustrates the various regions of operation for the dynamic clamp of FIG. 5A.

FIGS. 5A, 5B, and 6 illustrate an embodiment of the dynamic clamping approach described herein. FIG. 5A illustrates a high level diagram of a clamp circuit. FIG. 5B illustrates a high level block diagram of an embodiment of a control circuit of FIG. 5A. FIG. 6 illustrates the various regions of operation for the dynamic clamp of FIGS. 5A and 5B that reduces power consumption as compared to a standard fixed clamp, while also providing a fast collapse of the magnetic field to reduce the chance for damage to relay contacts and preventing damage to the main switch M0 by clamping the flyback voltage to a safe level. Note that FIG. 5A shows a 36V power supply, which will result in more power dissipation in the clamp and more potential power savings as compared to the nominal 24V power supply shown in FIGS. 1 and 2. In FIG. 5A, the main switch M0 sources the current supplied to the inductive load 503. The switch M0 switches with a switching frequency shown, e.g., in FIG. 7. The clamp circuit includes transistors M2 and M1 and control logic 505. The voltage present at node 507 is supplied through the parasitic diode 508 to node 514 when M0 is on and supplying current to the inductive load 503. The transistor M1 includes a bulk or parasitic diode 512 that is reversed biased when M1 is on and functions to stand off the voltage from the power supply 509 present on node 514 to ensure that with transistors M1 and M2 off, a path to ground is not available through the clamp circuit through parasitic structures.

In an embodiment, the components in region 501 are disposed on a single integrated circuit. In such an embodiment, the node 507 corresponds to an integrated circuit pad coupled to the inductive load 503. In other embodiments, at least some of the components in 501 are not part of the same integrated circuit.

When clamping, M1 acts as a diode and M2 controls the clamp level. Initially, the clamp voltage level is a low voltage, e.g., 1V, and then the clamp level switches to a high clamp voltage, e.g., 20V, as the contacts of the relay get closer to releasing. The clamp voltages may be positive or negative depending on the configuration of the inductive load and the clamp. As used herein, the "higher" clamp voltage refers to a higher magnitude voltage (also referred to as absolute value). Thus, e.g., a −20V clamp has the higher clamp voltage than a "lower" −1V clamp because its magnitude (−20V) is greater than the magnitude (−1V) of the smaller clamp.

The current through the loop decreases as the contacts get closer to releasing. When M0 switches off, both transistors M1 and M2 turn on to provide the 1V clamp level. In another embodiment, a diode replaces M1. The control signal that switches transistor M0 on and off may be supplied to the clamp control circuit 505 to indicate when to initiate the low voltage clamp. Alternatively, the voltage at node 514 may be sensed to indicate when switch M0 has opened and thus when to turn on the low voltage clamp. Note that the 1V clamp level is just an example and other low voltage clamp levels can be used in other embodiments. The voltage level of the lower voltage clamp depends on the process technology, the particular circuit implementation, and the desired power savings.

Referring to both FIGS. 5A and 6, the bottom portion of FIG. 6 illustrates the inductor current in mA versus time. The top portion of FIG. 6 illustrates the voltage at node 507 between the clamp and the inductor. Initially the switch M0 supplies current to the inductor in region of operation 601. The current 603 through the inductor is approximately 650 mA and the voltage 605 at the node 507 is approximately 30 V. In the example of FIG. 5, the main switch M0 opens around 122 ms resulting in the avalanche of the main switch M0 in region 607. Note that some implementations may be fast enough that M0 never avalanches. The system sets a 1V clamp voltage in response to the switch being turned off, which may be indicated by the resulting change in voltage at nodes 507 (and 514). Absent the clamp, the voltage at node 507 would be a high flyback voltage as the inductor tries to maintain current through the inductor potentially damaging main switch M0. The 1V clamp maintains the clamp node at slightly under 0 volts during the region of operation 609. During region 609, the clamp voltage remains at a low level to reduce power consumption while the inductor current is still high. The inductor current decreases during this period and approaches a current level, e.g., 400 mA, or 80% of the rated current. Remember that relay specification may provide that the relay contacts remained closed at 80% of rated current and are guaranteed to release at 30%. Current sense element 511, e.g., a resistor, may be used with difference amplifier 515 to generate an indication of the current flowing through the inductor by sensing current flowing through the loop formed by the inductor and the clamp. That current indication is supplied to the control logic to help determine when to switch from the low voltage clamp to the high voltage clamp. Note that while a separate current sense element 511 is shown, the difference amplifier 515 may sense the voltage across the resistance (rds) of transistor M1.

The control circuit monitors the current through the inductor using sense element 511 in region of operation 609 and when the inductor current reaches 400 mA, the system switches to the high voltage (e.g., 20V) clamp resulting in region of operation 611. The 400 mA current level indicates the current level is at 80% of rated current. A typical relay guarantees contact at 80% of rated current and guarantees contact release at 30% of rated current. In order to maintain armature momentum at release and reduce arcing and wear to the contacts, full clamp voltage should be utilized before the contact release point of 30%. Switching to the high voltage clamp at 80% of rated current (or 400 mA) is exemplary and other current levels may be utilized as the current level indicating when switch to the high clamp voltage to achieve great power savings. For example, the high voltage clamp may switch on at 50% of rated current or 250 mA or between 50% and 80%.

With a 20V clamp operating the voltage at the clamp/inductor node 507 drops to approximately −20V. During region of operation 611, the higher clamp voltage ensures the armature momentum is maintained. The clamp/inductor node voltage remains at the high clamp voltage until the inductor completely discharges. At that point the final region of operation 615 occurs with the inductor discharged and the clamp and the switch off.

FIG. 5B illustrates a high level block diagram of an embodiment of the clamp control circuit 505. The current compare circuit 521 compares the current sense 516 to a reference current value 523, to determine when the current through the inductor loop has dropped to the desired threshold level, e.g., 400 mA. Note that in an embodiment the reference current value 523 is programmable so that any appropriate percentage of rated current, e.g., from approximately 50% to approximately 80% may be specified. In a typical embodiment, the current reference is supplied as a digital value from programmable storage 540 and converted to an analog value in a digital to analog converter before being supplied to the current compare circuit 521. The current compare signal 522 is supplied to M2 gate drive circuit 527. Voltage error circuit 525 generates an error signal 526 indicating the difference between a voltage reference signal 524 and the voltage sense signal from node 514.

Note that there are alternative voltage sense options. For example, the voltage may be sensed from node 514 to node 507 or across the inductor from ground to node 507. Such voltage sense options may be made in conjunction with or as alternatives to the voltage sense at node 514. In the embodiment shown in FIG. 5A, the transistor M1 and sense element 511 are outside the feedback loop that controls the gate voltage of M2. That is the voltage sense at node 514 results in that node being the node that is regulated. Thus, voltage drops on sense element 511 and transistor M1 do not affect the gate drive on transistor M2. An alternative is to move the voltage sense so that current sense element 511 and transistor M1, or just M1, are inside the feedback loop. With those elements inside the feedback loop, the feedback loop will then try and compensate for the voltage drop caused by these components by driving the gate of M2 to a higher voltage. Note that 511 can be on the source of M2.

The voltage reference signal 524 specifies the clamp level, e.g., 20V. The clamp level may also be programmable to allow the user to specify the voltage reference signal 524. In a typical embodiment, the voltage reference is supplied as a digital value from storage 542 and converted to an analog voltage reference in a digital to analog converter before being supplied to the voltage error circuit. The M2 gate drive circuit receives the voltage error signal and adjusts the gate drive signal 530 to maintain the clamp at the desired voltage reference value. The current compare signal is also supplied to the M2 gate drive signal to indicate when to switch from the low voltage clamp to the high voltage clamp. The clamp control circuit also includes a level shift circuit 528 that shifts the voltage of the M1 gate drive signal to account for the different source connections of M2 and M1. Finally, the M1 gate drive circuit 529 receives the level shifted voltage signal, provides an appropriate amount of gain to drive M1 well above its threshold voltage with gate drive signal 532. The control structure shown in FIG. 5B includes a combination of analog and digital logic with the particular allocation between analog or digital functionality being determined according to the needs of a particular implementation.

Figure 7:
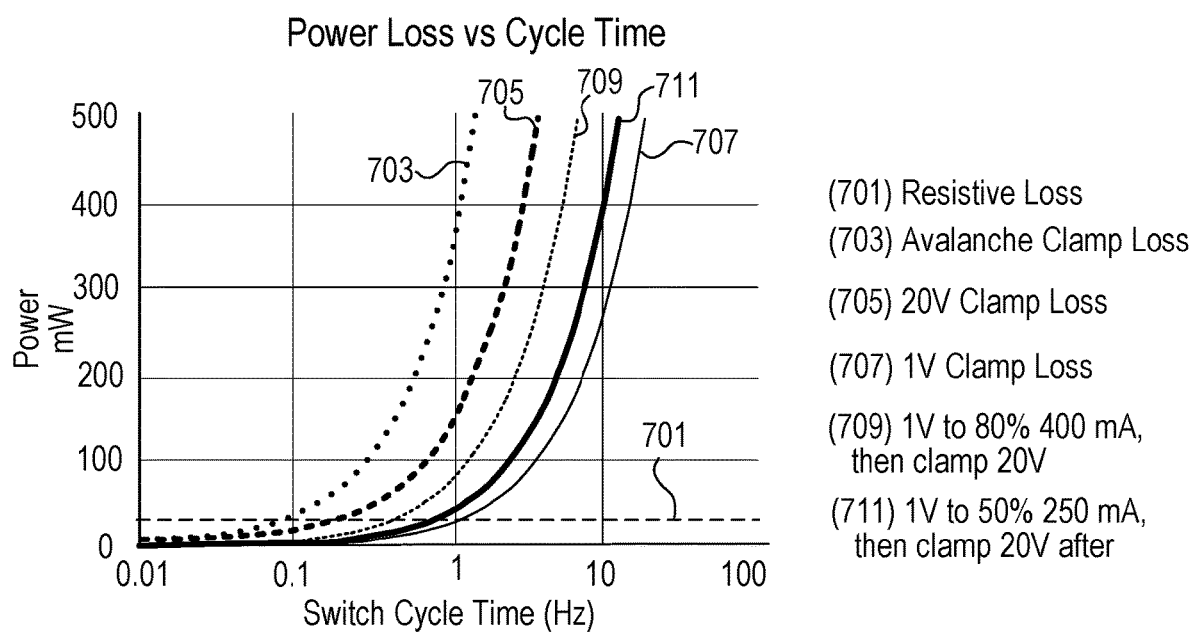
FIG. 7 illustrates a graph of power loss versus cycle time for various scenarios.

FIG. 7 illustrates a graph of power loss versus cycle time for various scenarios. FIG. 7 shows the constant resistive loss 701 caused by the loss through the main switch (see e.g., switch M0 in FIG. 5A), the avalanche clamp loss 703, the 20V clamp loss 705, and the 1V clamp loss 707. FIG. 7 illustrates the advantage of the dynamic clamp architecture. Curve 709 illustrates power loss for a 1V clamp being maintained until the inductor current has dropped to 80% (400 mA) of rated current and at 400 mA the clamp switches to 20V. As shown in FIG. 7, at a switch cycle time of 1 Hz, the power utilized for curve 709 is approximately 75 mW as compared to the fixed 20V clamp (curve 705) of approximately 140 mW. Curve 711 illustrates power loss where the 1V clamp was maintained until the inductor current had dropped to 50% (or 250 mA) of rated current and at 250 mA the clamp switches to 20V. As shown in FIG. 7, at a switch cycle time of 1 Hz, the power utilized for curve 711 is approximately 40 mW as compared to the fixed 20V clamp of approximately 140 mW. The longer the clamp is maintained at the lower clamp voltage, the bigger the improvement in power savings. However, there is diminishing power savings from switching at less than 50% of rated current. Thus, an embodiment allows switching from a low voltage clamp to a high voltage clamp to be programmable between 50% to 80% of rated current by writing to storage 530 (see FIG. 5).

In other embodiments, the clamp voltage is set back to 1V towards the end of the inductive discharge after the relay contacts open at 30% of rated current to save some additional power. That can be done in addition to setting the clamp voltage to 1V until loop current is at 50-80% of rated current at the beginning of the discharge cycle. In addition, setting the clamp voltage after the relay contacts open can be done instead of at the beginning of the discharge cycle. Thus, e.g., the clamp would be set at 20V at the beginning and switch to 1V after the contacts open. That approach does not provide as much power savings as setting the clamp voltage to 1V at the beginning of the discharge, but it does save some power.

Figure 8:
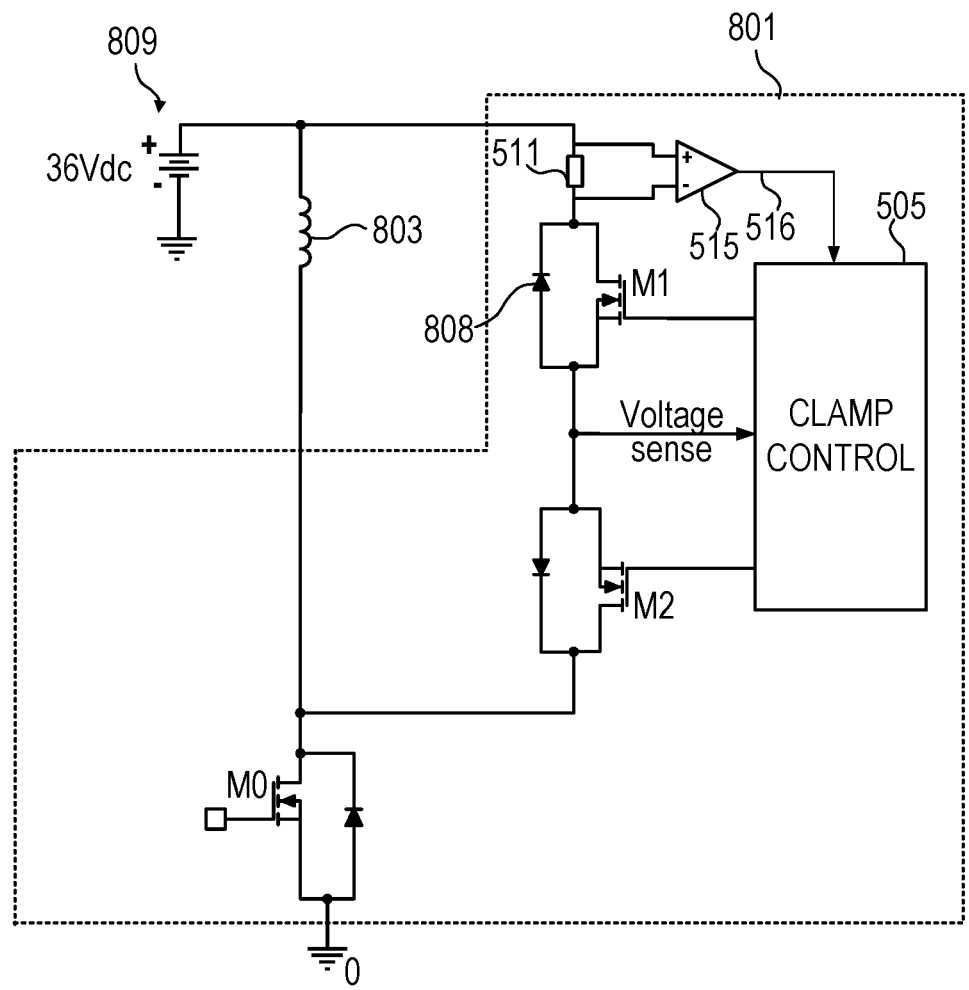
FIG. 8 illustrates an embodiment where the main switch sinks the current being supplied to the inductor rather than sourcing the current.

FIG. 8 illustrates an embodiment where M0 sinks the current being supplied to the inductor 803 rather than sourcing the current as shown in FIG. 5. When M0 is on, the diode 808 of M1 stands off the voltage from power supply 809. When M0 switches off, M1 and M2 are turned on to provide a 1V clamp. When the current sense logic indicates the current has reached the desired level of rated current, the clamp control logic turns on the higher clamp voltage by appropriately controlling the gate voltage of transistor M2. Absent the 1V clamp, the high voltage from the inductor flyback voltage could damage the switch. In the embodiments shown in FIGS. 5A and 8, absent the clamp, the flyback voltage would be limited by the avalanche breakdown of switch M0, e.g., 60V. In some embodiments, that voltage could damage the switch, but even if switch M0 is not damaged, the resulting power dissipation would be very high. Therefore, it is desirable to minimize the time spent with the switch in avalanche breakdown by utilizing the clamp as soon as possible after the switch M0 turns off.

Figure 9:
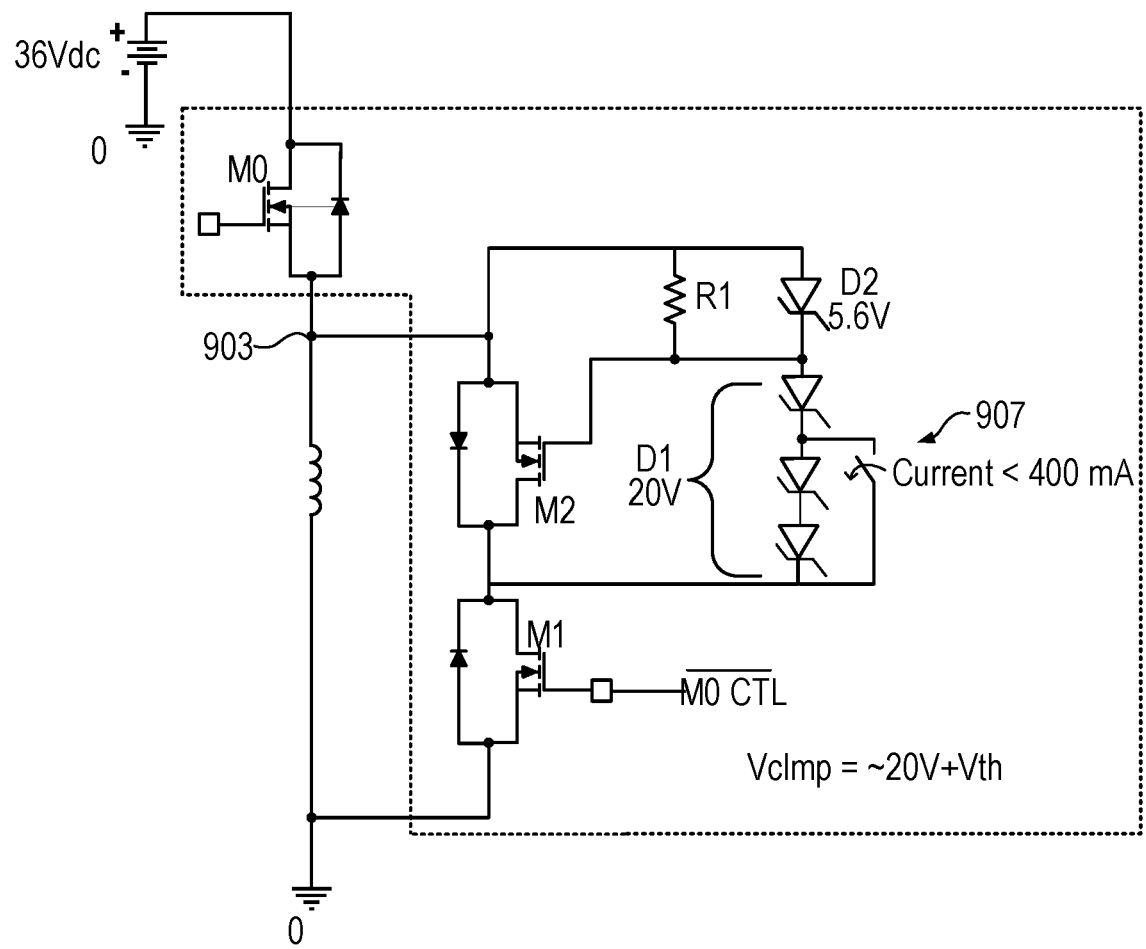
FIG. 9 illustrates another embodiment of a dynamic clamp to reduce power consumption.

FIG. 9 illustrates another embodiment of a dynamic clamp to reduce power consumption. In the embodiment of FIG. 9, Vclmp=~20V+Vth of M2. M1 is controlled by a digital signal that is an inverted and level-shifted version of the control signal that switches M0. When M0 switches off, M1 switches on. Alternatively, M1 can be controlled by an amplified and level shifted version of M2 $V_{GS}$. The series Zener diodes provide the 20V clamp level such that the gate voltage of M2 is determined by the reverse bias level across diodes D1. In addition, an appropriate number of the D1 diodes are bypassed by switch 907 to provide the initial low voltage clamp until the current through the inductor returned clamp reaches 400 mA (or other desired rated current threshold). R1 establishes a gate bias voltage for M2 that turns on M2 when the voltage exceeds the threshold voltage of M2 and functions as a pulldown resistor to shut off M2 when current no longer flows through diode D2. Diode D2 limits the $V_{GS}$ of M2 to a maximum value of 5.6V to protect the gate of M2 from being damaged by an overvoltage. Note that while FIG. 9 illustrates a sourcing configuration for main switch M0, a sinking configuration such as shown in FIG. 8 could readily be adopted to incorporate the control structure of FIG. 9.

Figure 10:
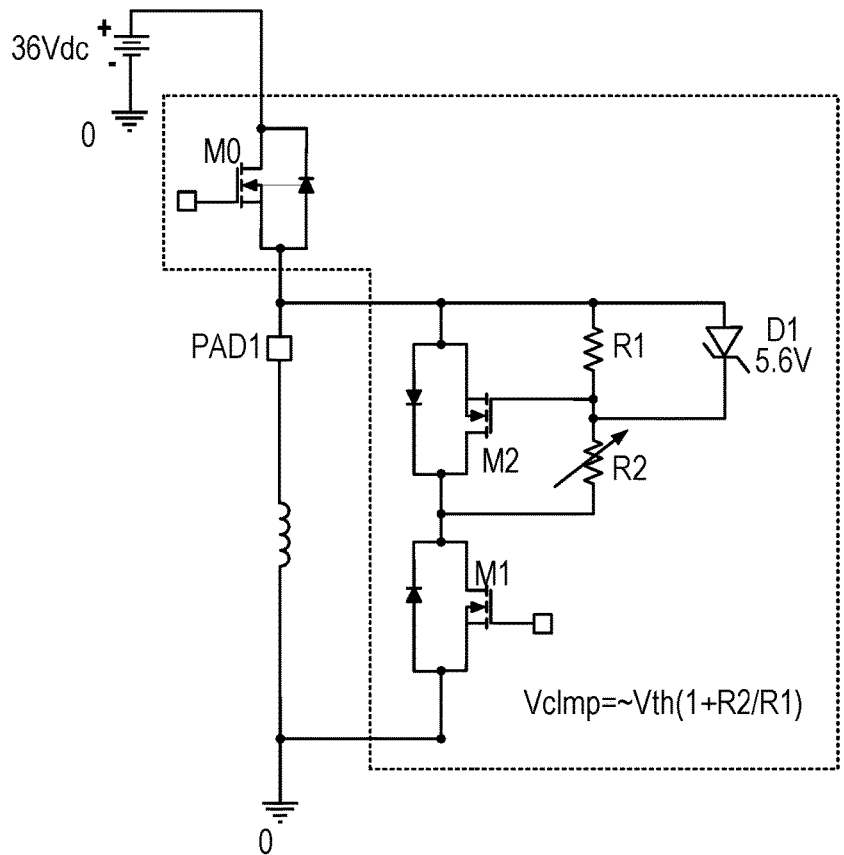
FIG. 10 illustrates an alternative dynamic clamp embodiment.

FIG. 10 illustrates an alternative dynamic clamp embodiment where the clamp voltage Vclmp=~Vth(1+R2/R1). M1 may again be controlled by the inverse of the control signal that switches M0 on and off. When operating in the low voltage clamp region, the resistance R2 may be made low. When operating in the high voltage clamp region, the resistance R2 may be increased to achieve the desired high voltage clamp level. Note that while FIG. 10 illustrates a sourcing configuration for main switch M0, a sinking configuration such as shown in FIG. 8 could readily be adopted to incorporate the control structure of FIG. 10. Programmable clamp voltages can be achieved by varying R1 and/or R2.

In an embodiment, the clamp control logic can utilize training to provide additional accuracy and save more power. For example, referring again to FIG. 5A, the control logic can monitor current through the main switch M0 (using a current sensor not shown) when the current is flowing through M0 and the inductive load. That allows the current to the inductive load to be accurately measured. 50-80% of the measured current can then be used as the trigger point from shifting from the low voltage clamp to the high voltage clamp.

In addition, training can be used to maximize power savings by maintaining the low voltage clamp for as long as possible while still ensuring that the high voltage clamp is in place before the relay contacts begin to break. The inductance of the relay coil changes once the relay contacts are opened. That means that the rate of change of inductor discharge current versus time changes when the relay contacts open. That change (not shown in FIG. 6) in the rate of change of inductor discharge current versus time, indicating the change in inductance, can be sensed to determine the precise current at which the contacts of that particular relay will open. By using training, the current threshold at which the clamp voltage changes from 1V to 20V can initially be set to 80% of rated current. But after the first switching cycle with a particular relay, the current threshold can be reduced to slightly above the level at which the relay contacts open. That ensures that the power savings is tailored and maximized for each particular relay.

Referring again to FIG. 5A, an embodiment includes temperature sensor 518 that supplies a temperature indication 519 to provide a temperature safety mechanism for the clamp circuit. The temperature indication is supplied to M2 gate drive circuit 527 (see FIG. 5B). If the temperature sensor 518 detects a high temperature, e.g., >145 C, the clamp control circuit forces the clamp to be limited to the low voltage clamp (e.g., 1V) or return to the low voltage clamp if the clamp is currently configured as a high voltage clamp. That ensures that the power dissipated is minimized to reduce the contribution to heating from the clamp while still providing protection from the flyback voltage.

Figure 11:
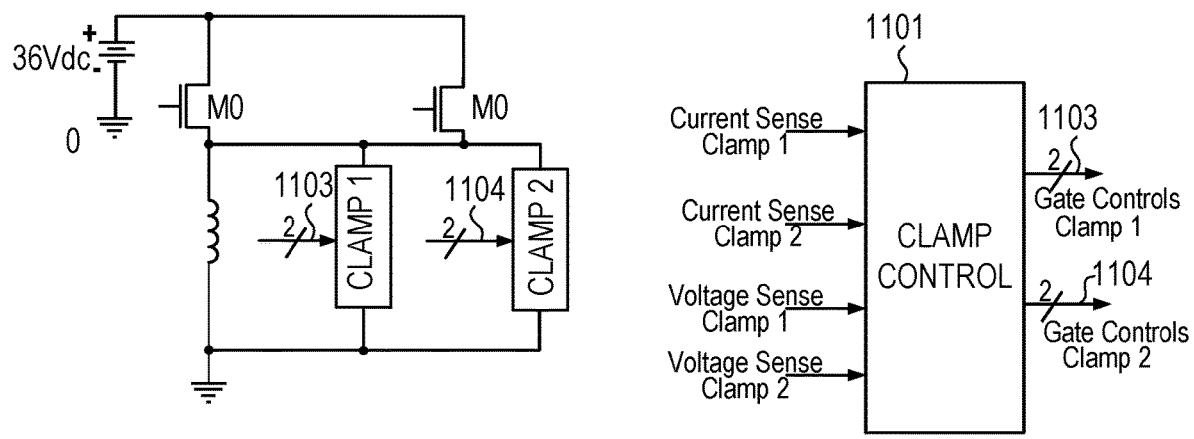
FIG. 11 illustrates a system with clamps configured in parallel.

Embodiments may utilize the clamps configured in parallel where they share current as shown in FIG. 11. A typical reason for connecting clamps in parallel as shown in FIG. 11 is to accommodate an inductive load having higher current requirements than a single channel can provide. FIG. 11 shows two clamps being utilized in parallel but additional clamps, e.g., four or more may be utilized in parallel. As shown in FIG. 11, the control logic 1101 receives current sense values from both clamps. The control logic controls the multiple clamps synchronously to avoid any one of the clamps from receiving all the current if one clamp was at 1V and the other clamp was still off or at 20V. Thus, the control logic also receives the voltage sense values from each clamp. The control logic provides the gate controls 1103 and 1104 in the parallel configuration to ensure the clamps switch to the 1V and 20V configuration synchronously. In addition, the control logic operates to switch both clamps to a high voltage clamp configuration (e.g., 20V) once either one of the clamps reaches the current threshold, e.g., 400 mA.

Figure 12:
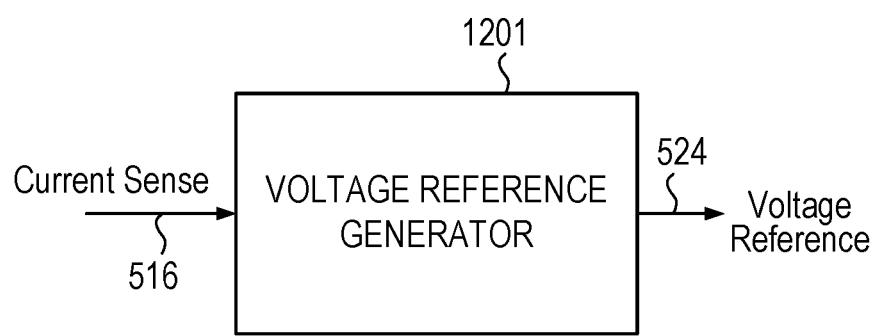
FIG. 12 illustrates an embodiment in which the current in the inductor loop determines a continuous range of clamp values.

While two discrete clamp voltages have been described, other embodiments utilize a continuous range of clamp values that are determined by the current in the inductor loop. Thus, for example, referring again to FIG. 12, the voltage reference generator circuit 1201 generates the voltage reference 524 (see FIG. 5B) based on the current sense 516. In one embodiment, the voltage reference generator circuit increases the reference voltage linearly (and thus the clamp voltage) as the current through the inductor loop decreases.

Rather than utilize a continuous range of clamp values, multiple discrete clamp values may be utilized (rather than just 1V and 20V). As the current through the loop decreases in regions 607, 609, and 611 (see FIG. 6), the clamp voltage increases in magnitude in discrete increments. For example, the clamp voltage may increase from 1V to 20V in four increments. Referring again to FIG. 5B, a digital value corresponding to the current sense signal 516 may be used to select the appropriate clamp voltage reference for voltage reference value 524 from storage 542 to implement the clamp voltage increasing in increments based on the current value. The number and size of each increment depends on the particular application.

Thus, various aspects have been described relating to dynamic clamping of inductive loads. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    setting a first clamp circuit to a first clamp voltage to clamp a flyback voltage of an inductive load;
    sensing a current in a loop that includes the first clamp circuit and the inductive load and providing a sensed current indication; and
    setting the first clamp circuit to a second clamp voltage responsive to the sensed current indication being at a first current value, the second clamp voltage being greater in magnitude than the first clamp voltage.

2. The method as recited in claim 1 further comprising:
    setting the first clamp circuit to the first clamp voltage responsive to a switch supplying current to the inductive load being turned off; and
    wherein the first clamp circuit is at the second clamp voltage before relay contacts of a relay switch controlled by the inductive load open.

3. The method as recited in claim 2 further comprising:
    determining the first current value based on training, the training including determining a second current value corresponding to a change in a rate of change of discharge by the inductive load indicating when the relay contacts open; and
    basing the first current value on the second current value.

4. The method as recited in claim 1 further comprising setting the first clamp circuit to a plurality of additional clamp voltages greater in magnitude than the first clamp voltage responsive to respective current values of the sensed current indication, the respective current values including the first current value, the additional clamp voltages including the second clamp voltage.

5. The method as recited in claim 1, wherein a magnitude of the first clamp voltage is between approximately 0.5 volts and approximately 1.5 volts and a magnitude of the second clamp voltage is approximately an order of magnitude or more greater than the first clamp voltage.

6. The method as recited in claim 1, further comprising:
    operating a second clamp circuit in parallel with the first clamp circuit;
    sensing a second current through a second loop including the second clamp circuit and providing a second sensed current indication;
    setting the second clamp circuit to the second clamp voltage substantially simultaneously with the first clamp circuit responsive to the sensed current indication being at the first current value; and
    setting the second clamp circuit and the first clamp circuit to the second clamp voltage substantially simultaneously responsive to the second sensed current indication being at the first current value.

7. The method as recited in claim 1, further comprising:
    sensing a temperature; and
    if the temperature is above a threshold temperature, setting the first clamp circuit to be limited to the first clamp voltage.

8. The method as recited in claim 1, further comprising programming one or more of the first clamp voltage, the second clamp voltage, and the first current value.

9. The method as recited in claim 1, further comprising:
    controlling a clamp voltage of the first clamp circuit by controlling a first gate voltage of a first transistor and controlling a second gate voltage of a second transistor.

10. The method as recited in claim 9, further comprising:
    sensing the clamp voltage and supplying a sensed clamp voltage indication; and
    adjusting the first gate voltage to maintain the first clamp circuit at the second clamp voltage based on the sensed clamp voltage indication.

11. An apparatus comprising:
    a first clamp circuit for clamping a flyback voltage associated with an inductor, the first clamp circuit being configured to have a first clamp voltage responsive to a switch controlling current flowing in the inductor being turned off;
    a current sense circuit to provide a first indication of current flowing through a first loop formed by the inductor and the first clamp circuit; and
    wherein the first clamp circuit is configured to have a second clamp voltage, higher in magnitude than the first clamp voltage, responsive to the first indication indicating that current flowing through the first loop is at a first current value.

12. The apparatus as recited in claim 11 wherein the first current value is set so that the first clamp circuit is at the second clamp voltage before contacts of a relay switch controlled by the inductor open.

13. The apparatus as recited in claim 11, wherein the second clamp voltage is an order of magnitude or more, greater in magnitude than the first clamp voltage.

14. The apparatus as recited in claim 11, wherein responsive to respective values of the first indication of current flowing through the first loop, the first clamp circuit is set to a plurality of additional clamp voltages greater in magnitude than the first clamp voltage, the additional clamp voltages including the second clamp voltage, and the respective values including the first current value.

15. The apparatus as recited in claim 11, further comprising:
    a second clamp circuit in parallel with the first clamp circuit, the second clamp circuit coupled in a second loop with the inductor;
    a second current sense circuit to provide a second indication of current flowing through the second loop;
    a control circuit configured to set the first clamp circuit to the second clamp voltage and to set the second clamp circuit to the second clamp voltage substantially simultaneously responsive to the first indication of current flowing through the first loop indicating that current flowing through the first loop is at the first current value; and
    wherein the control circuit is further configured to set the first clamp circuit to the second clamp voltage and to set the second clamp circuit to the second clamp voltage substantially simultaneously responsive to the second indication of current flowing through the second loop indicating that current flowing through the second loop is at the first current value.

16. The apparatus as recited in claim 11 further comprising:

a temperature sensor to sense a temperature associated with the apparatus; and wherein if the temperature is above a threshold temperature a control circuit is configured to limit the first clamp circuit to a limited clamp voltage that is lower than the second clamp voltage.

17. The apparatus as recited in claim 16, wherein the limited clamp voltage is the first clamp voltage.

18. The apparatus as recited in claim 11, wherein the first clamp circuit further comprises:
   a first device including a diode to hold off voltage from a power supply coupled to the inductor through the switch; and
   a clamp transistor serially coupled to the first device and controlling a clamp voltage of the first clamp circuit according to a gate voltage of the clamp transistor.

19. The apparatus as recited in claim 18, further comprising:
   a voltage sense circuit to sense the clamp voltage and supply a sensed clamp voltage indication;
   compare logic to compare the sensed clamp voltage indication and a target clamp voltage indication and supply an error indication; and wherein a control circuit is configured to adjust a gate voltage of the clamp transistor to maintain the first clamp circuit at the second clamp voltage based on the error indication.

20. An apparatus comprising:
   a first switch configured to cause current to be supplied to an inductive load when turned on; and
   a clamp circuit for clamping a flyback voltage resulting from turning off the first switch, the clamp circuit configured to have a first clamping voltage responsive to the first switch being turned off, and having one or more additional clamping voltages, higher than the first clamping voltage, responsive to a current level through a loop including the clamp circuit and the inductive load being lower than a predetermined current level.

21. The apparatus as recited in claim 20,
   wherein the predetermined current level is between approximately a first current level where contact is guaranteed for contacts of a relay switch controlled by the inductive load and a second current level where contact release is guaranteed for the contacts of the relay switch.

* * * * *